(12) United States Patent
Guenther et al.

(10) Patent No.: US 12,385,949 B2
(45) Date of Patent: Aug. 12, 2025

(54) SEMI-AUTOMATED OSCILLOSCOPE NOISE COMPENSATION BASED ON POWER SPECTRAL DENSITY CHARACTERIZATION

(71) Applicant: Tektronix, Inc., Beaverton, OR (US)

(72) Inventors: Mark L. Guenther, Portland, OR (US); Pavel R. Zivny, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 52 days.

(21) Appl. No.: 18/121,558

(22) Filed: Mar. 14, 2023

(65) Prior Publication Data
US 2023/0324439 A1 Oct. 12, 2023

Related U.S. Application Data

(60) Provisional application No. 63/320,963, filed on Mar. 17, 2022.

(51) Int. Cl.
*G01R 13/02* (2006.01)

(52) U.S. Cl.
CPC ................. *G01R 13/029* (2013.01)

(58) Field of Classification Search
CPC ...... G01R 13/029; G01R 13/22; G01R 29/26; G01R 15/16; G01R 19/0084
USPC .................................................. 324/126, 72.5
See application file for complete search history.

(56) References Cited

U.S. PATENT DOCUMENTS

| | | | |
|---|---|---|---|
| 2011/0103451 A1* | 5/2011 | Agoston | H04L 1/205 375/226 |
| 2012/0189300 A1* | 7/2012 | Lindsay | H04B 10/0731 398/26 |
| 2014/0093150 A1* | 4/2014 | Zalev | A61B 5/726 382/128 |
| 2015/0075287 A1* | 3/2015 | Herzog | G01H 9/004 73/655 |
| 2021/0042521 A1* | 2/2021 | Zheng | H04B 10/0799 |

\* cited by examiner

*Primary Examiner* — Christopher P McAndrew
(74) *Attorney, Agent, or Firm* — Miller Nash LLP; Andrew J. Harrington

(57) ABSTRACT

A method of dynamically determining an oscilloscope noise characteristic includes retrieving a power spectral density (PSD) model of noise from a storage based upon a current configuration of the oscilloscope, generating a representation of any filtering being applied to a waveform generated by a device under test, using the PSD and the representation to produce a modified power spectral density, and using the modified power spectral density to determine a dynamic oscilloscope noise characteristic. A test and measurement instrument has one or more inputs to acquire waveforms from a device under test (DUT), one or more processors to retrieve a power spectral density (PSD) model of noise from a database, generate a representation of any filtering being applied to a waveform generated by the DUT, use the PSD and the representation to produce a modified PSD, and use the modified PSD to determine a dynamic instrument noise characteristic.

18 Claims, 6 Drawing Sheets

SEMI-AUTOMATED OSCILLOSCOPE NOISE COMPENSATION BASED ON POWER SPECTRAL DENSITY CHARACTERIZATION

CROSS-REFERENCE TO RELATED APPLICATIONS

This disclosure claims benefit of U.S. Provisional Application No. 63/320,963, titled "SEMI-AUTOMATED OSCILLOSCOPE NOISE COMPENSATION BASED ON POWER SPECTRAL DENSITY CHARACTERIZATION," filed on Mar. 17, 2022, the disclosure of which is incorporated herein by reference in its entirety.

TECHNICAL FIELD

This disclosure relates to test and measurement instruments, and more particularly to compensation of noise internal to a test and measurement instrument such as an oscilloscope ("scope").

BACKGROUND

Several data communication standards, such as DDR5 (Double Data Rate 5), Thunderbolt, USB-4v1 and some Ethernet variants, have included either optional or mandatory compensation for oscilloscope imperfections such as noise and timebase jitter. Compensating for the voltage noise of an oscilloscope based upon manual measurements of noise variance is cumbersome and inflexible. Changes in oscilloscope configuration such as voltage scale, equalization or embed/de-embed filters typically requires a unique calibration.

FIG. 1 shows a typical measurement scenario where the oscilloscope's Gaussian random voltage noise, shown as $RN_s$, impacts measurement of both the device under test's (DUT) noise and jitter. The internal structure of the DUT 10 may be represented by a behavioral model that captures the most important characteristics. The data generator 12 on the DUT 10 generates ideal symbols which are emitted from the D flip-flop 13 according to timing events supplied by the clock 14. The emitted symbols are shaped, intentionally and unintentionally, by step response filter $h_u(t)$ 16. The signal at TP1 is affected by the timebase random jitter $RJ_i$ and the random noise $RN_i$ which are interesting characteristics of the DUT. The oscilloscope 18 adds random noise $RN_s$ 19 at TP3, making efforts to measure the DUT jitter and noise inaccurate. The circuitry at the oscilloscope's input, sometimes referred to as the oscilloscope's front end, may include amplifiers, attenuators, splitters, probes or other components, but their collective random noise contributions are here effectively modeled with the single component $RN_s$. The DUT signal, combined with unwanted oscilloscope contributions, is received by the oscilloscope and there it is optionally amplified and then converted to a digital form by the sample and hold (S/H) and analog-to-digital converter (ADC) at 20. Generally, digital signal processing (DSP) can be used to improve measurement accuracy on the resulting signal.

The oscilloscope's random noise may be different for each oscilloscope channel, of which there are typically several, and may also vary with oscilloscope settings such as scale and offset. Among the simplest ways to characterize instrument noise is to disconnect the DUT from the input (often replacing it with a termination), configure the oscilloscope settings the same way as will be used for the measurement, and then characterize the residual random noise, usually by acquiring a sample noise waveform for analysis. One should note that termination is not necessarily required, but any external stimuli to any inputs to the oscilloscope needs to be removed. The DUT may then be re-attached, and the potentially compensable measurement made. A significant disadvantage to this fully manual process is that it must be repeated, including removal and reattachment of the DUT, any time any setting is changed.

Currently available oscilloscopes, together with their analysis software, include various manners of noise characterization and compensation. Some rely on a fully manual process for establishing the noise value(s) whereas others automate some calculations and process steps, but the calibration generally must be repeated whenever any of a wide range of oscilloscope settings or measurement configurations are changed. A need exists for a less cumbersome way to characterize and use noise compensation values.

For a time-domain analog waveform (time series) representing the noise floor of a physical instrument in some specific configuration, one can quantify the waveform's random noise power using a single value, $\sigma^2$, the waveform's variance, the average difference between each value in the time series and the mean of that series. Equivalently, one can quantify $\sigma$, the waveform's standard deviation, which is the positive square root of the variance. In following discussions it is understood that references to standard deviation could as easily use the variance, and vice versa.

The variance of a time series is often calculated directly on the series. It is well known that the variance can also be calculated by application of Parceval's Theorem, wherein the calculation is performed on the Fourier Transform of the time series. The Fourier Transform of a time series representing a signal is given the name Power Spectral Density (PSD). Calculation of the variance (or standard deviation) using this principle is shown in FIG. 2 and in the following equation:

$$\sigma^2 = \int_{-\infty}^{+\infty} PSD(f)df.$$

Tektronix provides an Oscilloscope Noise Characterization application to help with noise compensation. This application may be used when performing measurements for a DDR5 application, for example. It improves on the fully manual approach by automating the measurement and storage of noise variances for a multiplicity of oscilloscope configurations, while only requiring the DUT to be replaced by a termination, or other means to remove stimuli from the oscilloscope inputs, a single time. FIG. 3 shows a simplified example of this approach.

As shown in FIG. 3 a termination, or other means to remove external stimuli from the oscilloscope input, 22 replaces the DUT. For each foreseeable combination of oscilloscope scale, offset, record length, bandwidth, and input channel 24, the application captures a representative waveform and calculates the total noise variance at 28, $\sigma_n^2$ (or the standard deviation of the noise, $\sigma_n$), and stores it in a in a database 30. Given the number of parameters over which this characterization takes place, the database size can be very large and the characterization process slow. The oscilloscope front end 24 and any compensation at 26 cause variations due to oscilloscope scale, offset, record length, bandwidth, etc.

Furthermore, the simplified architecture of FIG. 3 only solves a narrow subset of user scenarios. Many test configurations require application of one or more signal processing operations such as embedding or de-embedding a network model, or linear equalization, such as continuous time linear equalization (CTLE) or feed forward equalization (FFE), or any signal filtering, such as Bessel-Thomson, which typically changes the effective oscilloscope noise and so invalidates the saved $\sigma_n$ value. In the current art, these one or more signal processing operations are combined into a single digital filter, shown at 27 in FIG. 4.

For the DDR5 case, this situation is handled by storing a unique $\sigma_n$ value for each test configuration of interest. Each digital filter consumes a resource of which there are typically only a few available in current oscilloscopes.

This further expands the dimensions of the noise database, slows the characterization process, and runs into practical barriers since it is not uncommon to need far more than four digital filters. Lastly, this process depends on being able to predict all possible combinations of filters, including de-embedding, linear equalization, and Bessel-Thomson filtering, at the time of calibration. In many cases this is impractical if not impossible.

Embodiments of the disclosure address these and other shortcomings of the prior art.

DETAILED DESCRIPTION

Embodiments of the disclosure include first characterizing oscilloscope noise by creating a storage, such as a database, of PSD measurements rather than static oscilloscope noise variance, $\sigma_n^2$, measurements. After attachment of a DUT, this is followed by compensation of measurements by applying PSD information together with knowledge about the current test configuration. The embodiments allow noise-shaping due to digital signal processing to be computed after characterization and with almost limitless flexibility. The embodiments include generating a set of power spectral density models of the oscilloscope noise, and storing it in a storage, such as a database. The process relies on removing any external stimuli from the oscilloscope inputs as in prior approaches, but instead of storing static oscilloscope noise values (variance or standard deviation), the power spectral density of the oscilloscope's acquisition channels is stored, providing an adequately detailed description of the oscilloscope's noise versus frequency.

Figure 6:
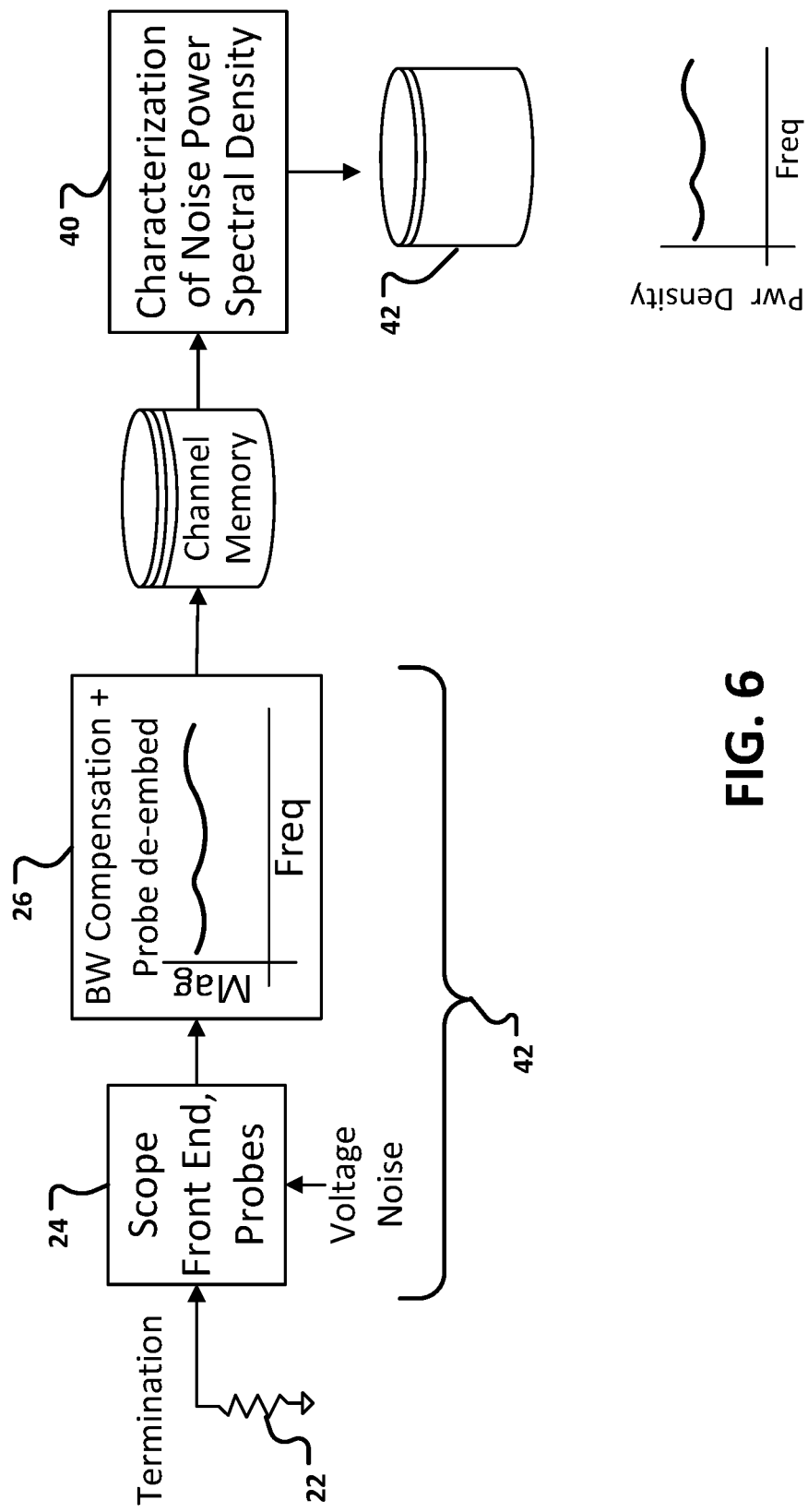
FIG. 6 shows an embodiment of a method for noise characterization based upon power spectral density.

FIG. 6 shows an embodiment of a noise characterization process based on power spectral density (PSD). As in previous approaches, the input circuitry of the oscilloscope, possibly including probes 24, is disconnected from a DUT and possibly terminated at 22. The compensation and probe de-embedding are performed as usual at 26. Some oscilloscope settings such as scale and offset, applied within 42 as shown, influence oscilloscope noise. The noise may also vary by channel on an oscilloscope that has multiple channels, as most do. For each value of those influential oscilloscope settings, the process calculates the PSD model of the noise, so the process gathers a collection of these models at 40 and stores them in the characterization storage at 42. The collection of oscilloscope settings may be referred to below as the configuration of the oscilloscope. As discussed further below, the embodiments have an advantage in that they employ a reduced set of the available settings for the oscilloscope. This reduces the overall size of the storage needed for the PSD models.

Figure 7:
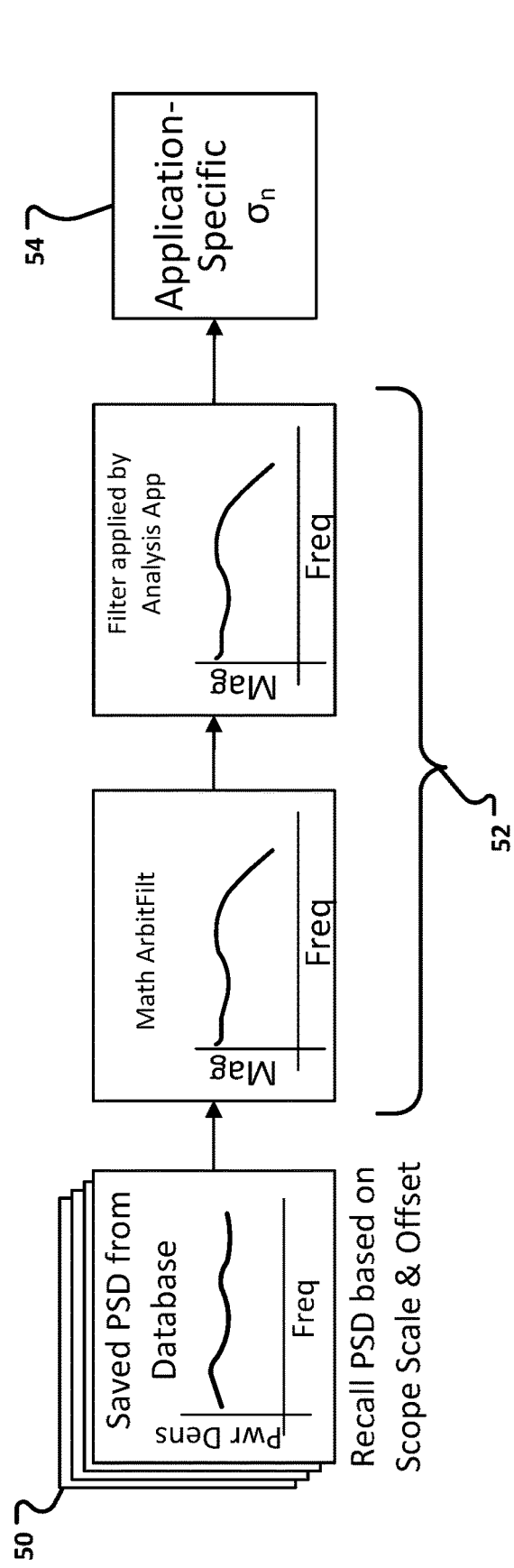
FIG. 7 shows an embodiment of a method to dynamically determine an oscilloscope noise characteristic based upon a specific processing configuration.

After the characterization process generates a characterization database or other collection, users can employ the oscilloscope to make measurements. The user can attach a DUT to the oscilloscope and configure a set of measurements, along with any digital signal processing required to satisfy the needs of the measurements. FIG. 7 shows an embodiment of the noise compensation process. In FIG. 7, the process applies the digital signal processing, 52, that is used by the measurement to a PSD model from the characterization storage at 50. The process selects the PSD model based upon the current oscilloscope configuration of the front end settings, allowing computation of the oscilloscope noise variance, or the standard deviation $\sigma_n$, applicable to this specific processing configuration.

One should note a significant difference in the proposed embodiments lies in the noise characterization occurring before the application of user-controlled filtering, which as used herein means any process that affects the frequency distribution (shape) of the noise, and is under user's control, rather than permanent part of the system. Indeed, the filtering need not even be known at the time of characterization. As discussed previously, current approaches characterize the noise in a static fashion that requires application of each filter. While the proposed embodiments do rely upon a (preferably previously-obtained) noise characterization of the oscilloscope, the process of noise compensation adapts that to generate a dynamic noise characteristic for any filter subsequently chosen. One should also note that the noise characteristic used herein comprises the noise variance or standard deviation, the square root of the variance, but other noise characteristics may be used.

In FIG. 7, the noise compensation process accesses the PSD storage at 50 and retrieves the PSD model for the applicable oscilloscope configuration of settings. As mentioned above, typically this will involve the oscilloscope scale and offset, but no limitation to using only those two settings is intended, nor should any be implied. The configuration of settings used will encompass a reduced set of the available settings for the oscilloscope. It should be understood that this process might in fact be multiple processes, operating serially or concurrently, for example for several measurements that use different filters, or a single measurement that uses several different offsets. Each instance of the process 'knows' the filtering being applied as it is operating in the actual testing environment for the measurement and DUT. The process operates on the information about the filtering to produce a representation of the filtering being applied to the waveform. This may result from a customer-specific design, equalization filters applied to meet a standard, etc. The process combines the representation of the filtering with the PSD profile to produce a modified power spectral density of the noise being compensated. In one embodiment, the process computes the product of the representation and the initial PSD from the storage.

The process then integrates the new PSD, referred to as a modified, or filtered, PSD over the frequency range of interest to arrive at the noise variance. The process then can use the noise variance, or its square root, the standard deviation, as the noise characteristic. Further processing of the waveform can use the noise characteristic to mitigate the effects of the oscilloscope noise on the resulting measurement.

In a specific example for ease of understanding of the noise compensation process, assume that the noise-shaping filter is a composite finite impulse response (FIR) filter representing the dynamic variables 52 in FIG. 7, perhaps comprised of an embedded reference channel, a CTLE filter and a Bessel-Thomson filter. In one embodiment, the process would convert the filter response, using the FIR taps, h[n], to a frequency-domain representation H[k]. The process would then convert the frequency-domain representation to a magnitude square form |H²[k]|. Using the magnitude-squared form, the process would then, if necessary, re-sample the spectral magnitude vector to match the spacing used by the PSD storage.

Figure 1:
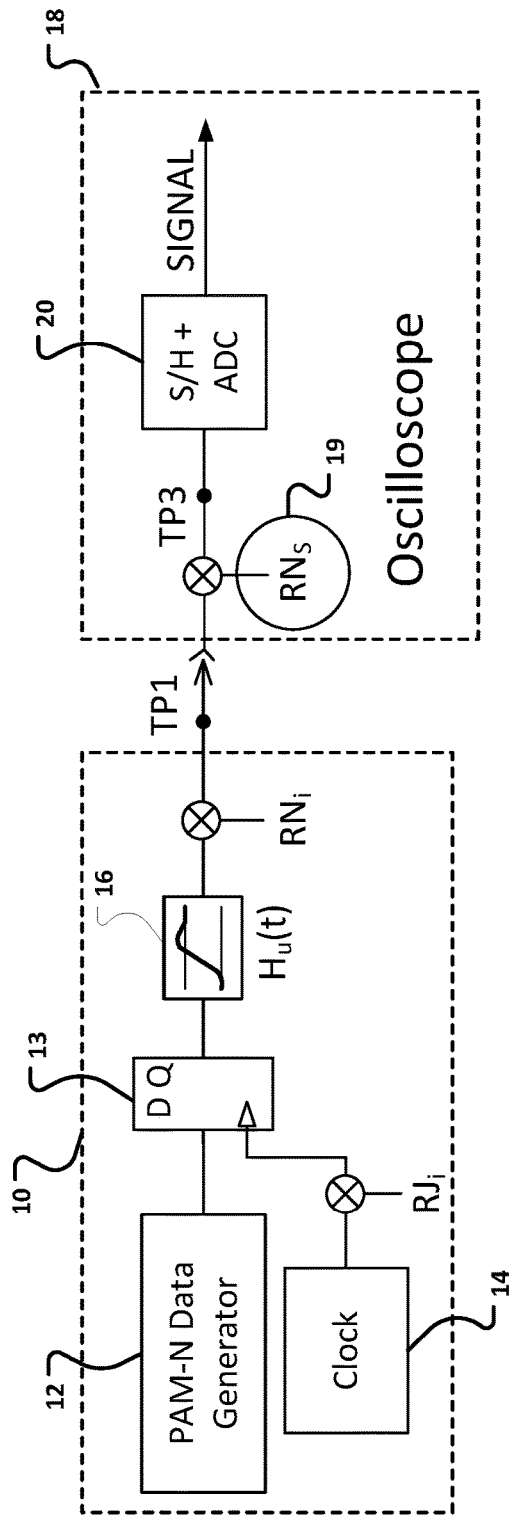
FIG. 1 shows an example of a model for jitter and noise in a serial transmitter and measurement system.
Figure 2:
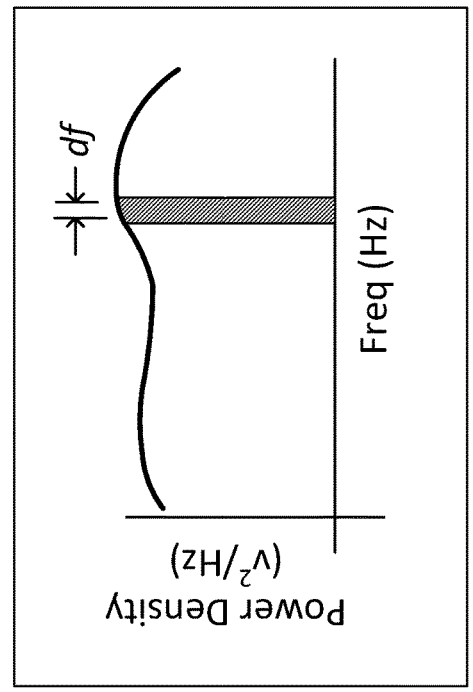
FIG. 2 shows a graphical representation of waveform variance being calculated by integration of the power spectral density of the waveform.
Figure 3:
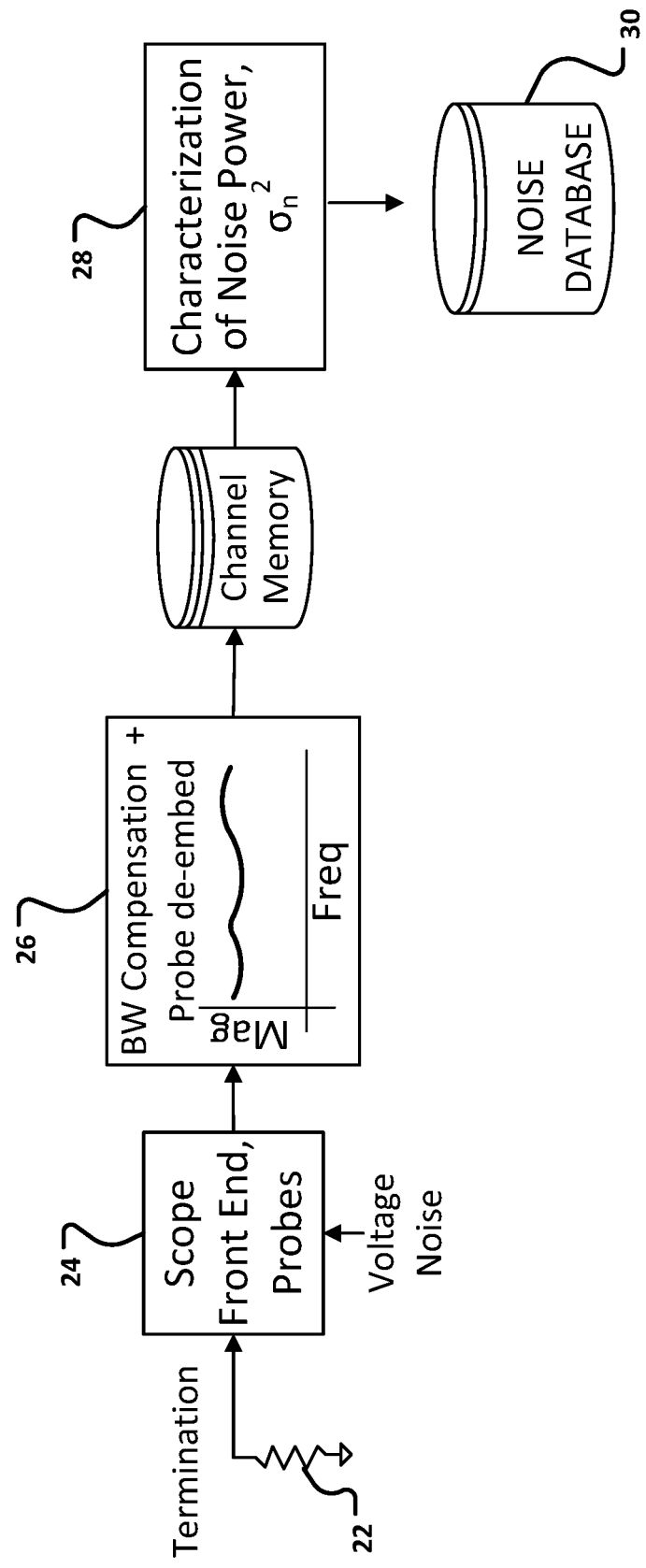
FIG. 3 shows an example of a current, static approach for characterizing oscilloscope acquisition noise.

The process then takes the initial PSD from the storage and multiplies it on a point-by-point basis with the re-sampled magnitude-squared filter function to produce the modified PSD, $PSD_{filt}$. As discussed above regarding FIG. 2, the modified PSD is integrated over the frequency range of interest to produce the noise variance $\sigma_n^2$ according to Equation 1.

$$\sigma_n^2 = 2 \cdot \int_{f_{low}}^{f_{high}} PSD_{filt}(f) df \quad \text{[Equation 1]}$$

Figure 8:
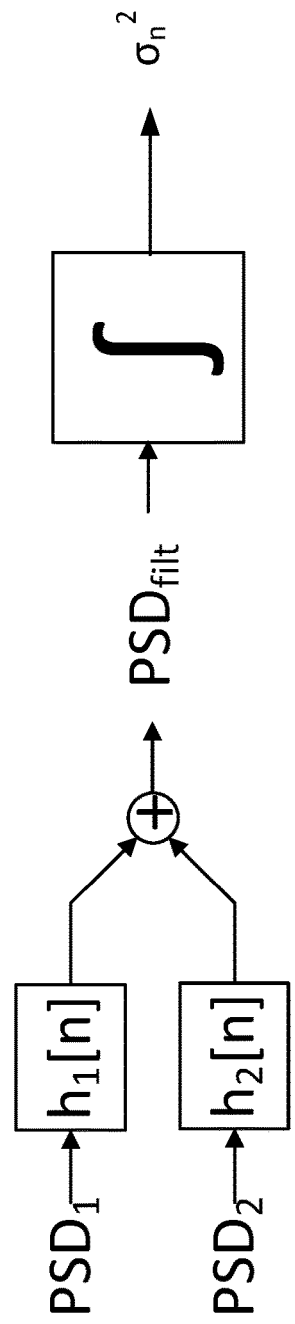
FIG. 8 shows a diagram of an embodiment for adapting a method to dynamically determine an oscilloscope noise characteristic for differential signals.

One special case of frequent interest is that of differential or pseudo-differential signals, wherein a final signal is created by calculating the mathematical difference between one waveform and its (nominally) algebraic inverse, the two waveforms usually coming from two separate oscilloscope channels. In this case, two PSD models, one for each corresponding oscilloscope source channel, are each multiplied by their own filter to get their own modified PSD. The process would then add these together to form $PSD_{filt}$. So, for this case, the computation of $\sigma_n^2$ is described by FIG. 8.

Note that the algebraic operation for noise may be 'addition', even if one would normally subtract the (−) signal from the (+) signal. Also, the above operation can be abstracted to a plurality of N signals where N>2.

One concern that may arise involves the size of the noise storage or database. As mentioned previously regarding FIG. 2, saving the PSDs takes up more space. Since the embodiments save entire PSDs instead of $\sigma_n^2$ values, one might expect the storage to grow significantly. However, the disclosed embodiment eliminates the need, in the prior art, to characterize over multiple parameters. These parameters include, but are not limited to, oscilloscope bandwidth, record length and multiple mathematical filters. In the embodiments here, the user-adjustable oscilloscope bandwidth can easily be modeled as a spectral filter and therefore can be implemented dynamically, removing the need to save all likely useful oscilloscope bandwidth settings. The process can handle shorter record lengths by integrating the filtered PSD from a different lower frequency limit. Math sources, or the mathematical functions of an oscilloscope, applied the FIR filters in the previous approaches. The embodiments apply these during analysis, so they do not need characterization. This also means that one effectively has access to as many math filters as one can imagine. These may include those that were not foreseen during noise characterization.

Furthermore, the size of each PSD may be smaller than one might assume. In an example, one could take a "brute-force" approach to computing a periodogram estimate of the power spectral density by performing a Fast-Fourier Transform (FFT) on the noise waveform's time record, and then compute the magnitude-squared values for the half of the transform corresponding to positive frequencies. For a waveform length of 10 million points, this would result in 5 million noise power density values, equally spaced on the frequency axis.

However, the noise floor of a typical instrument is dominated by almost-uniformly-distributed Gaussian noise combined with a few deterministic components that typically appear as very narrow spikes in the periodogram. The spikes can be removed since they are not part of the random noise. The remaining noise may be characterized using a much sparser frequency spacing than given by the FFT. For example, a logarithmic frequency spacing with 200 points per decade could characterize the noise from 25 kHz to 100 GHz with <1400 values.

The noise characterization storage size may also be reduced by avoiding storage of redundant data. For example, if the power spectral density is found to be nearly unchanged over a portion of the range of one of the independent variables such as scale or offset, then a single or a few PSDs may be saved for that range, and interpolation or look-up performed at the time the PSD needs to be retrieved for compensation purposes.

Almost all oscilloscopes are capable of saving acquired waveform data into a file on storage media, so that the waveform can subsequently be recalled for viewing or analysis. Such a recalled waveform is sometimes called a reference waveform. According to another aspect of the disclosure, if at the time when the oscilloscope saves a waveform, the noise PSD information corresponding to the oscilloscope's settings is available, the oscilloscope can also save that noise data.

Figure 4:
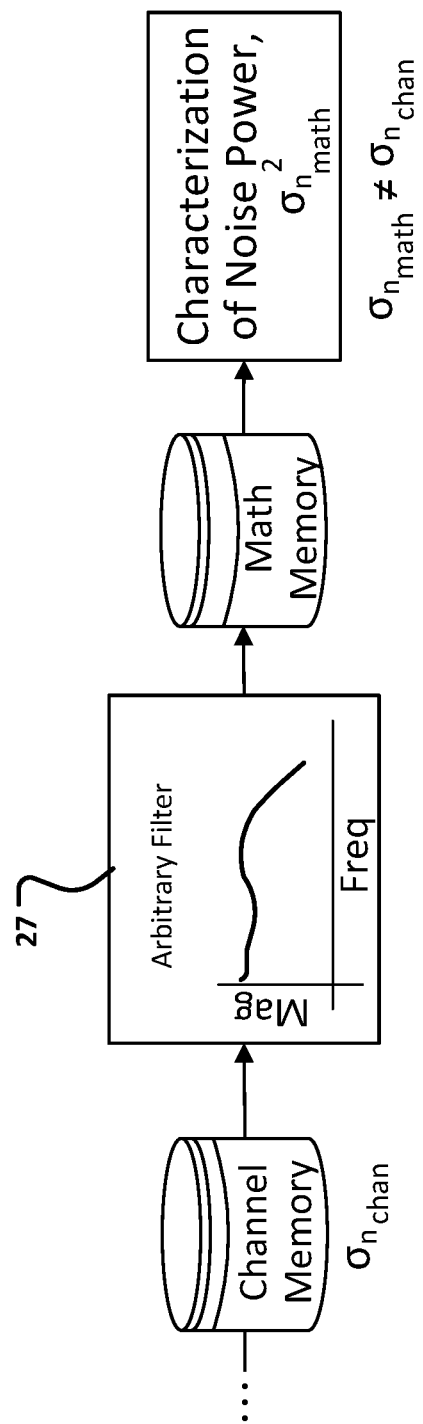
FIG. 4 shows an example of a current, adapted process for oscilloscope noise analysis with a dynamically varying signal channel.
Figure 5:
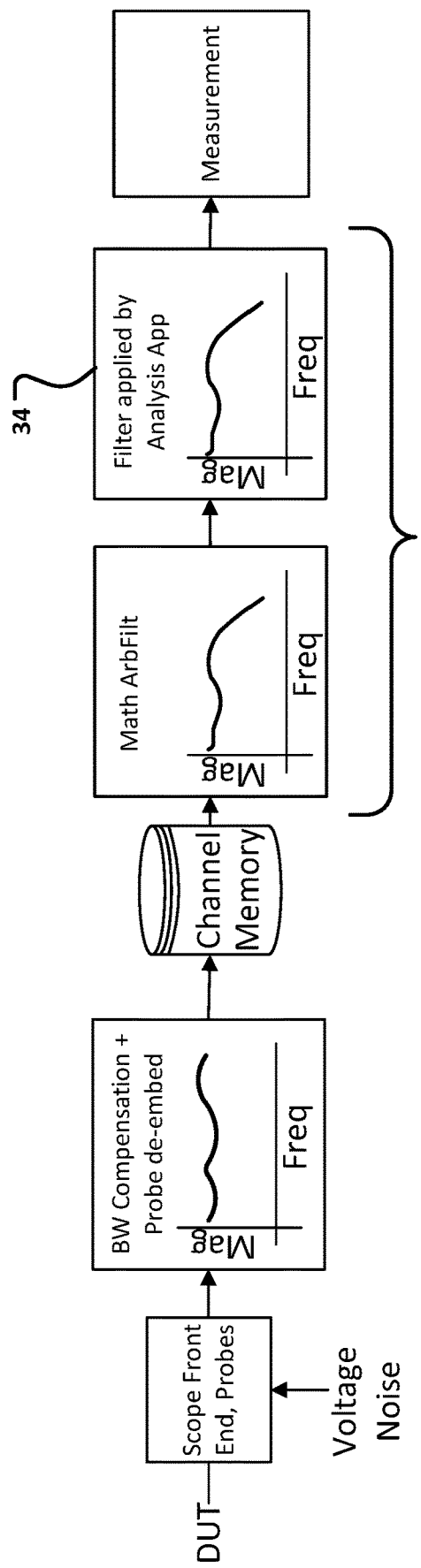
FIG. 5 shows an example of oscilloscope noise analysis with a dynamically varying signal channel composed of multiple filters.

In one implementation the noise characterization would be saved within the waveform file in a way that was backward-compatible with implementations that are not noise-spectrum aware. In another implementation, noise characterization would be saved in a proprietary binary file with the same base name as the waveform file but with a unique extension, such as "*.noise". Likewise, a waveform to which filtering had already been applied, such as at the right end of FIG. 4 at entering the measurement, could be saved along with its appropriately-filtered PSD information. In yet another implementation, the waveform file would contain a reference to the storage (such as a database), which would be saved along with the waveform file. In all cases, these augmented files would allow stored waveforms to be recalled and used for new noise-compensated measurements, with the stored noise information providing the basis for compensation.

The analysis application may operate on one or more processors in the oscilloscope or in network-attached auxiliary processors by execution of code in the form of instructions to cause the oscilloscope, or other test and measurement device to perform the methods of the embodiments. The above discussion has focused on the context of the oscilloscope being the test and measurement device because oscilloscope noise occurs during oscilloscope acquisition of the waveforms. However, other test and measurement devices in the future may acquire waveforms and contribute to noise. Therefore, any instrument that acquires waveforms and provides a source of noise to the measurement could employ the embodiments here.

Traditionally, compensating for the voltage noise of an oscilloscope based on manual measurements of noise variance ($\sigma_n$ or $\sigma_n^2$) is extremely cumbersome and inflexible, as any change in equalization or embed/de-embed filters typically require a unique calibration. Embodiments of the disclosure address these issues. Embodiments of the disclosure generally capture a rich spectral description of the oscilloscope's noise floor, and delays calculation of a noise variance until when the measurement will be made, at which time any filters (including Math arbitrary filters or DSP-applied filters) are known. Embodiments of the disclosure can handle literally any channel filter (CTLE, cable de-embed, reference loss channel, Bessel-Thomson, etc.) at the noise compensation time, and do not require knowing the filter at the time of acquisition or noise characterization.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the oscilloscope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description refers to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

All features disclosed in the specification, including the claims, abstract, and drawings, and all the steps in any method or process disclosed, may be combined in any combination, except combinations where at least some of such features and/or steps are mutually exclusive.

Each feature disclosed in the specification, including the claims, abstract, and drawings, can be replaced by alternative features serving the same, equivalent, or similar purpose, unless expressly stated otherwise.

EXAMPLES

Illustrative examples of the disclosed technologies are provided below. An embodiment of the technologies may include one or more, and any combination of, the examples described below.

Example 1 is a method of dynamically determining an oscilloscope noise characteristic, comprising: retrieving a power spectral density model of noise from a storage based upon a current configuration of the oscilloscope; generating a representation of any filtering being applied to a waveform generated by a device under test; using the power spectral density and the representation to produce a modified power spectral density; and using the modified power spectral density to determine a dynamic oscilloscope noise characteristic.

Example 2 is the method of Example 1, further comprising applying the dynamic oscilloscope noise characteristic in further processing of the waveform.

Example 3 is the method of either of Examples 1 or 2, further comprising creating the storage of power spectral density models for the oscilloscope by: removing external stimuli from any inputs to the oscilloscope; acquiring a plurality of waveform signals, each waveform signal being acquired for a different configuration of the oscilloscope; calculating power spectral density model for each waveform in the plurality of waveforms; and storing the power spectral density models in the storage.

Example 4 is the method of Example 3, wherein the different configurations of the oscilloscope uses a reduced set of settings available for the oscilloscope.

Example 5 is the method of any of Examples 1 through 4, wherein generating a representation of any filtering comprises: converting tap values for filter taps to a frequency-domain representation; squaring the magnitude of the frequency-domain representation to produce a magnitude-squared frequency-domain representation; and resampling the spectral magnitude-squared vector in the frequency domain representation to obtain frequency spacing commensurate with that used in the power spectral density model.

Example 6 is the method of any of Examples 1 through 6, wherein using the modified power spectral density comprises integrating the modified spectral density over a frequency range of interest to produce oscilloscope noise variance as the dynamic oscilloscope noise characteristic.

Example 7 is the method of Example 6, further comprising taking the square root of the oscilloscope noise variance to produce the standard deviation of the oscilloscope noise as the dynamic oscilloscope noise characteristic.

Example 8 is the method of any of Examples 1 through 7, wherein the method repeats the retrieving, generating, and using for more than one channel on the oscilloscope to produce more than one modified power spectral density, and then combines the more than one modified power spectral densities to produce the modified spectral density used to determine a dynamic oscilloscope noise characteristic.

Example 9 is a test and measurement instrument, comprising: one or more inputs through which waveforms can be acquired from a device under test (DUT); one or more processors to execute code that causes the one or more processors to: retrieve a power spectral density model of noise from a database based upon current instrument settings; generate a representation of any filtering being applied to a waveform generated by the DUT; use the power spectral density and the representation to produce a modified power spectral density; and use the modified power spectral density to determine a dynamic instrument noise characteristic.

Example 10 is the instrument of Example 9, wherein the one or more processors are further configured to execute code to cause the one or more processors to apply the dynamic instrument noise characteristic in further processing of the waveform.

Example 11 is the instrument of either of Examples 9 or 10, wherein the one or more processors are further configured to execute code that cause the one or more processors to: acquire a plurality of waveform signals, each waveform signal being generated for a different configuration of the oscilloscope; calculate a power spectral density model for each waveform in the plurality of waveforms; and store the power spectral density models in the storage.

Example 12 is the instrument of Example 11, wherein the different configurations of the oscilloscope use a reduced set of settings available for the oscilloscope.

Example 13 is the instrument of any of Examples 9 through 12, wherein the code that causes the one or more processors to generate a representation of any filtering comprises code that causes the one or more processors to: convert tap values for filter taps to a frequency-domain representation; square the magnitude of the frequency-domain representation to produce a magnitude-squared frequency-domain representation; and resample at least one of spectral magnitude vectors in the magnitude-squared frequency domain representation to obtain frequency spacing commensurate with the power spectral density model.

Example 14 is the instrument of any of Examples 9 through 13, wherein the code that causes the one or more processors to use the modified power spectral density causes the one or more processors to integrate the modified spectral density over a frequency range of interest to produce oscilloscope noise variance as the dynamic oscilloscope noise characteristic.

Example 15 is the instrument of Example 14, wherein the one or more processors are further configured to execute code that causes the one or more processors to take the square root of the oscilloscope noise variance to produce the standard deviation of the oscilloscope noise as the dynamic oscilloscope noise characteristic.

Example 16 is the instrument of any of Examples 9 through 15, wherein the processors are further configured to execute code to cause the one or more processors to retrieve, generate and use for more than one channel on the oscilloscope to produce more than one modified power spectral density, and combine the more than one modified power spectral densities to produce the modified spectral density used to determine a dynamic oscilloscope noise characteristic.

Example 17 is a method of characterizing noise in an oscilloscope, comprising: removing external stimuli from the inputs to the oscilloscope; acquiring a plurality of waveforms, each waveform being generated for a different configuration of the oscilloscope; computing a power spectral density model for each waveform in the plurality of waveforms; and storing the power spectral density models in the storage.

Example 18 is the method of Example 17, wherein the different configurations of the oscilloscope use a reduced set of available settings for the oscilloscope.

Example 19 is the method of Example 18, wherein the reduced set of available settings includes scale, offset, and channel.

Example 20 is the method of any of Examples 17 through 19, wherein storing the power spectral density models includes storing the noise data for the configuration of the oscilloscope.

The previously described versions of the disclosed subject matter have many advantages that were either described or would be apparent to a person of ordinary skill. Even so, these advantages or features are not required in all versions of the disclosed apparatus, systems, or methods.

Although specific examples of the invention have been illustrated and described for purposes of illustration, it will be understood that various modifications may be made without departing from the spirit and oscilloscope of the invention. Accordingly, the invention should not be limited except as by the appended claims.

The invention claimed is:

1. A method of dynamically determining an oscilloscope noise characteristic, comprising:
  retrieving a power spectral density model of noise from a storage based upon a current configuration of the oscilloscope;
  generating a representation of user-controlled filtering to be applied by the oscilloscope to a waveform acquired from a device under test;
  using the power spectral density model of noise and the representation to produce a modified power spectral density model of noise;

using the modified power spectral density model of noise to determine a dynamic oscilloscope noise characteristic for the current configuration of the oscilloscope; and applying the dynamic oscilloscope noise characteristic in further processing of the waveform to compensate for oscilloscope noise in the waveform.

2. The method as claimed in claim 1, further comprising creating the storage of power spectral density models for the oscilloscope by:

removing external stimuli from input channels of the oscilloscope;

acquiring a plurality of noise-representing waveforms, each waveform being acquired for a different configuration of the oscilloscope;

calculating a power spectral density model of noise for each waveform in the plurality of waveforms; and storing the power spectral density models of noise in the storage.

3. The method as claimed in claim 2, wherein the different configurations of the oscilloscope use a reduced set of settings available for the oscilloscope.

4. The method as claimed in claim 1, wherein generating a representation of user-controlled filtering comprises:

converting tap values for filter taps to a frequency-domain representation;

squaring the magnitude of the frequency-domain representation to produce a magnitude-squared frequency-domain representation; and resampling the spectral magnitude-squared vector in the frequency domain representation to obtain frequency spacing commensurate with that used in the power spectral density model of noise.

5. The method as claimed in claim 1, wherein using the modified power spectral density of noise comprises integrating the modified spectral density over a frequency range of interest to produce oscilloscope noise variance as the dynamic oscilloscope noise characteristic.

6. The method as claimed in claim 5, further comprising taking the square root of the oscilloscope noise variance to produce the standard deviation of the oscilloscope noise as the dynamic oscilloscope noise characteristic.

7. The method as claimed in claim 1, wherein the method repeats the retrieving, generating, and using for more than one input channel on the oscilloscope to produce more than one modified power spectral density model of noise, and then combines the more than one modified power spectral density models of noise to produce the modified spectral density model of noise used to determine the dynamic oscilloscope noise characteristic.

8. A test and measurement instrument, comprising:

one or more input channels configured to acquire a waveform from a device under test (DUT); and one or more processors to execute code that causes the one or more processors to:

retrieve a power spectral density model of noise from a database based upon current settings of the test and measurement instrument;

generate a representation of user-controlled filtering to be applied by the test and measurement instrument to a waveform acquired from the DUT;

use the power spectral density model of noise and the representation to produce a modified power spectral density model of noise;

use the modified power spectral density model of noise to determine a dynamic instrument noise characteristic for the current settings of the test and measurement instrument; and apply the dynamic instrument noise characteristic in further processing of the waveform to produce a noise-compensated waveform.

9. The instrument as claimed in claim 8, wherein the one or more processors are further configured to execute code that cause the one or more processors to:

acquire a plurality of waveforms, each waveform being acquired for a different configuration of the instrument;

calculate a power spectral density model of noise for each waveform in the plurality of waveforms; and store the power spectral density models of noise in the storage.

10. The instrument as claimed in claim 9, wherein the different configurations of the instrument use a reduced set of settings available for the instrument.

11. The instrument as claimed in claim 8, wherein the code that causes the one or more processors to generate a representation of user-controlled filtering comprises code that causes the one or more processors to:

convert tap values for filter taps to a frequency-domain representation;

square the magnitude of the frequency-domain representation to produce a magnitude-squared frequency-domain representation; and resample at least one of spectral magnitude vectors in the magnitude-squared frequency domain representation to obtain frequency spacing commensurate with the power spectral density model of noise.

12. The instrument as claimed in claim 8, wherein the code that causes the one or more processors to use the modified power spectral density model of noise causes the one or more processors to integrate the modified power spectral density model of noise over a frequency range of interest to produce instrument noise variance as the dynamic instrument noise characteristic.

13. The instrument as claimed in claim 12, wherein the one or more processors are further configured to execute code that causes the one or more processors to take the square root of the instrument noise variance to produce the standard deviation of the instrument noise as the dynamic instrument noise characteristic.

14. The instrument as claimed in claim 8, wherein the one or more processors are further configured to execute code to cause the one or more processors to retrieve, generate and use for more than one input channel on the instrument to produce more than one modified power spectral density model of noise, and combine the more than one modified power spectral density models of noise to produce the modified spectral density model of noise used to determine the dynamic instrument noise characteristic.

15. A method of characterizing noise in an oscilloscope, comprising:

removing external stimuli from the input channels of the oscilloscope;

acquiring a plurality of waveforms, each waveform being acquired using a different configuration of the oscilloscope;

computing a power spectral density model of noise for each waveform in the plurality of waveforms; and storing the power spectral density models in a storage.

16. The method as claimed in claim 15, wherein the different configurations of the oscilloscope use a reduced set of available settings for the oscilloscope.

17. The method as claimed in claim 16, wherein the reduced set of available settings includes scale, offset, and channel.

18. The method as claimed in claim 15, wherein storing the power spectral density models includes storing noise data for the configuration of the oscilloscope.

* * * * *